US009231144B2

(12) United States Patent
Liu

(10) Patent No.: US 9,231,144 B2
(45) Date of Patent: Jan. 5, 2016

(54) LIGHT COLLECTING MODULE

(71) Applicant: Hung-Ta Liu, Hsinchu (TW)

(72) Inventor: Hung-Ta Liu, Hsinchu (TW)

( * ) Notice: Subject to any disclaimer, the term of this patent is extended or adjusted under 35 U.S.C. 154(b) by 78 days.

(21) Appl. No.: 14/175,487

(22) Filed: Feb. 7, 2014

(65) Prior Publication Data

US 2014/0225128 A1    Aug. 14, 2014

(30) Foreign Application Priority Data

Feb. 8, 2013    (TW) .............................. 102105315 A

(51) Int. Cl.
| | |
|---|---|
| *H01L 33/00* | (2010.01) |
| *H01L 21/00* | (2006.01) |
| *H01L 31/054* | (2014.01) |
| *H01L 25/16* | (2006.01) |
| *H01L 33/60* | (2010.01) |
| *H01L 31/173* | (2006.01) |
| *H01L 33/22* | (2010.01) |
| *H02S 10/40* | (2014.01) |
| *H02S 40/38* | (2014.01) |

(52) U.S. Cl.
CPC .......... *H01L 31/0543* (2014.12); *H01L 25/167* (2013.01); *H01L 31/0547* (2014.12); *H01L 31/173* (2013.01); *H01L 33/22* (2013.01); *H01L 33/60* (2013.01); *H02S 10/40* (2014.12); *H02S 40/38* (2014.12); *Y02E 10/50* (2013.01); *Y02E 10/52* (2013.01)

(58) Field of Classification Search
CPC ..... H01L 31/173; H01L 33/60; H01L 25/167; H01L 33/20; H01L 33/22
See application file for complete search history.

(56) References Cited

U.S. PATENT DOCUMENTS

| | | | | |
|---|---|---|---|---|
| 6,020,632 A | * | 2/2000 | Barone ................. | H01L 33/483 257/434 |
| 6,476,376 B1 | * | 11/2002 | Biegelsen ............ | B41J 11/0095 250/214.1 |
| 2010/0079711 A1 | | 4/2010 | Tanaka | |

FOREIGN PATENT DOCUMENTS

| | | |
|---|---|---|
| TW | 200944729 A1 | 11/2009 |
| TW | 201044043 A1 | 12/2010 |
| TW | M412373 U1 | 9/2011 |

* cited by examiner

*Primary Examiner* — Alonzo Chambliss

(74) *Attorney, Agent, or Firm* — Li & Cai Intellectual Property (USA) Office

(57) ABSTRACT

A light collecting module includes a pliable light guide, an inner light source, and a photocell. A surface of the light guide has a first area, a second area, and a third area. The first and second areas face each other, and the third area is adjacent to the first or second area. At least one optical structure is formed in the second area, and the photocell is adjacent to the third area. The optical structure is for redirecting ambient light incident on the first or second area such that the ambient light is guided to the third area by refraction or reflection and incident on the photocell. The optical structure is for redirecting the light from the inner light source such that the light is guided to the surface of the light guide by refraction or reflection and exits the light guide.

19 Claims, 7 Drawing Sheets

LIGHT COLLECTING MODULE

FIELD OF THE INVENTION

The instant disclosure relates to a light collecting module; in particular, to a pliable light collecting module.

DESCRIPTION OF RELATED ART

With the rapid development of technology and the economy, increasing fossil fuel depletion and greenhouse gas emission is concerned. For example, the use of oil, natural gas, coal and other polluting energy will lead to increasingly serious environmental damage. Moreover, these polluting energy gradually face to the problem of shortage, steady supply of energy has become a major worldwide issue. Therefore, non-polluting and renewable energy, such as hydro, wind, solar, biomass and other more has become more and more valued.

In recent years, alternative energy and renewable energy technology continue to be developed, and photoelectric conversion technology is the most valued. For example, solar cells can directly convert light energy into electrical energy, and not accompanied by the generation of greenhouse gases or polluting gas such as carbon dioxide, nitrogen oxides and sulfur oxides, which will not pollute the environment, to reduce the dependence on fossil fuels and provide a safe and independent source of electricity.

In order to meet the requirements of the miniaturization in packaging, the circuit board is also gradually evolved by the double-layer circuit board into a multilayer circuit board, thereby expanding the area of wiring available on the circuit board layout in the limited space of the circuit board through the interlayer connection technology.

SUMMARY OF THE INVENTION

The object of the instant disclosure is to provide a light collecting module. The light collecting module utilize at least one optical structure formed in a second area of a surface of a pliable light guide to redirect the ambient light to collect light and to form a surface light source.

The light collecting module includes a pliable light guide, an inner light source, and a photocell. A surface of the light guide has a first area, a second area, and a third area. The first area and the second area face each other, and the third area is adjacent to the first area or the second area. The optical structure is formed in the second area of the surface. The inner light source is connected to the pliable light guide, and the photocell is adjacent to the third area of the surface.

The optical structure is for redirecting ambient light incident on the first or second area of the surface such that the ambient light is guided to the third area by refraction or reflection and incident on the photocell. In addition, the optical structure is for redirecting the light from the inner light source such that the light from the inner light source is guided to the surface of the light guide by refraction or reflection and exits the light guide.

In summary, the light collecting module can redirect and collect the light incident on the surface of the pliable light guide toward the photocell for being optically coupled to the photocell. Meanwhile, the light collecting module can redirect the light from the inner light source to the surface of the light guide and exits the light guide for forming a surface light source.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

(First Embodiment of a Light Collecting Module).

Figure 1A:
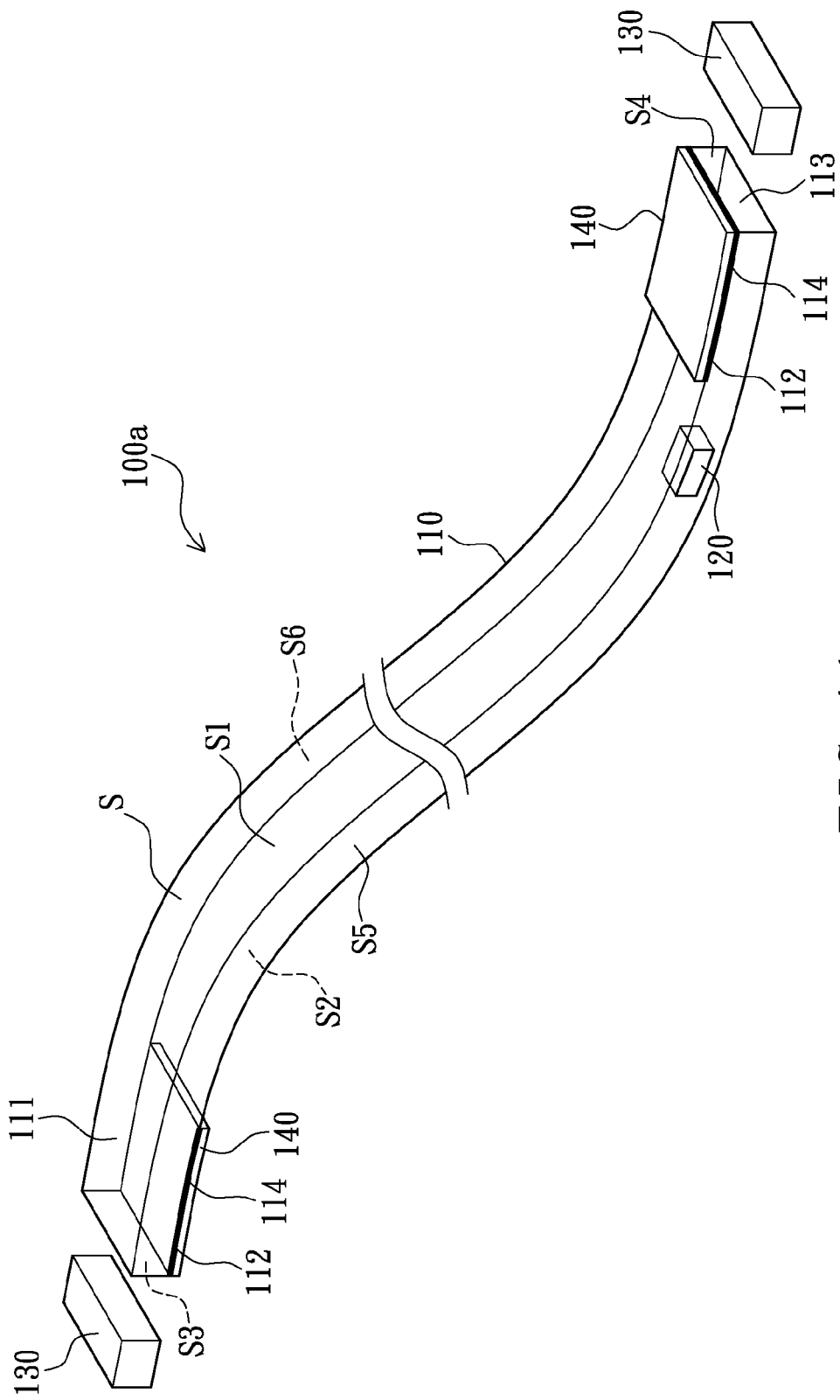
FIG. 1A illustrates a perspective view of a light collecting module in accordance with an embodiment of the instant disclosure.
Figure 1B:
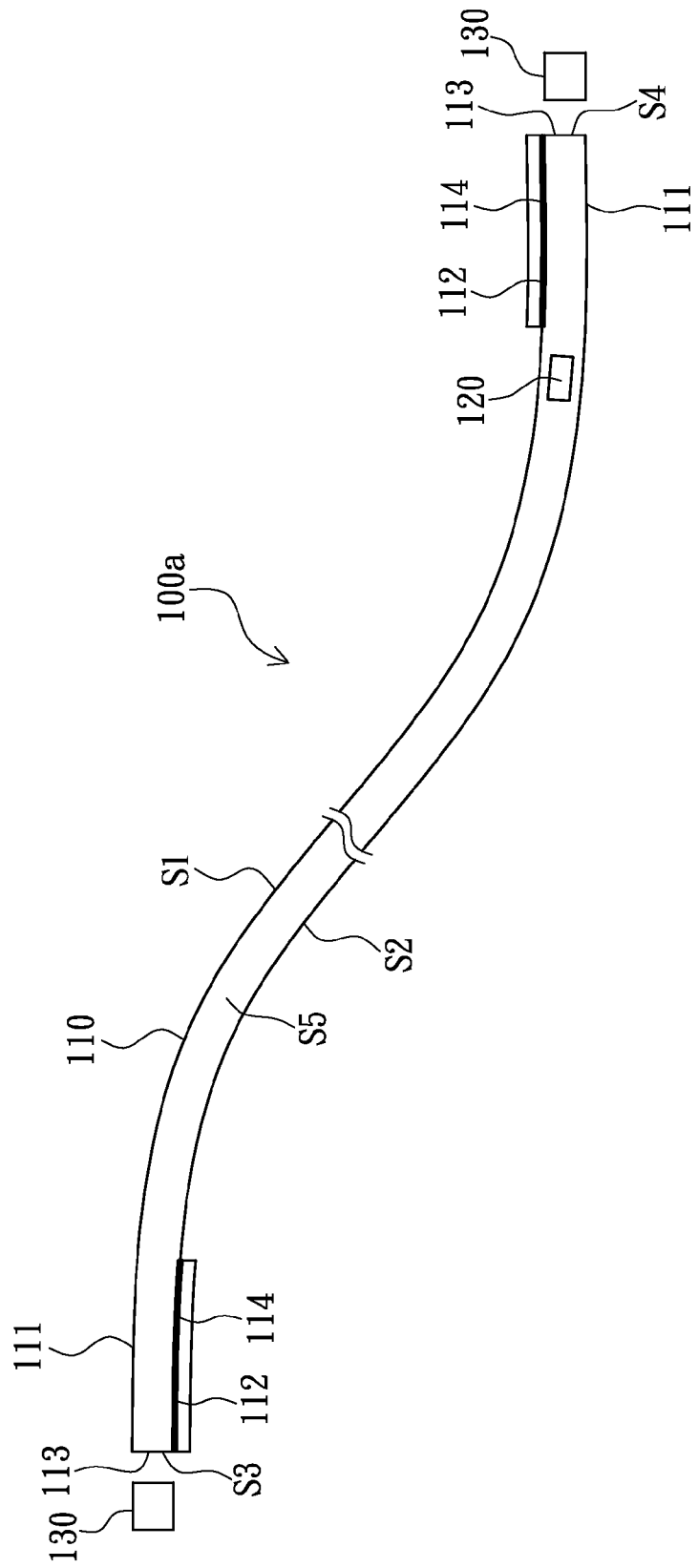
FIG. 1B illustrates a side view of a light collecting module in accordance with FIG. 1A.
Figure 2A:
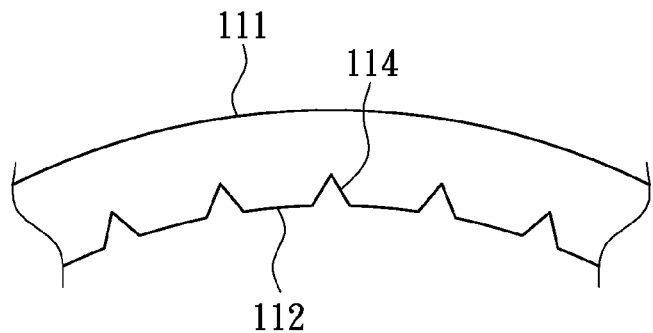
FIG. 2A is a side enlarged view, partially in area, showing a light collecting module in accordance with FIG. 1A.

Please refer to FIGS. 1A, 1B, and 2A. FIG. 1A illustrates a perspective view of a light collecting module 100a in accordance with an embodiment of the instant disclosure, FIG. 1B illustrates a side view of a light collecting module 100a in accordance with FIG. 1A, and FIG. 2A is a side enlarged view, partially in area, showing a light collecting module 100a in accordance with FIG. 1A. The light collecting module 100a includes a pliable light guide 110, an inner light source 120, and a photocell 130. A surface S of the light guide has a first area 111, a second area 112, and a third area 113. The first area 111 and the second area 112 face each other, and the third area 113 is adjacent to the first area 111 or the second area 112. At least one optical structure 114 is formed in the second area 112 of the surface S. The inner light source 120 is connected to the pliable light guide 110, and the photocell 130 is adjacent to the third area 113 of the surface S.

The pliable light guide 110 is flexible and made of optically transmissive materials that are transparent to radiation. In the instant embodiment, the pliable light guide 110 may have elongate rectangular shape and measure, for example, 0.1 mm (millimeter) to 50 mm in thickness. In alternate embodiment, the pliable light guide 110 may have a thickness more than 50 mm. An upper surface S1, a lower surface S2 facing the upper surface S1, and side surfaces S3, S4, S5, and S6 form the surface S of the pliable light guide 110. In other words, the upper surface S1 and the lower surface S2 are bound by the side surfaces S3, S4, S5, and S6. Note that in another embodiment, the pliable light guide 110 may be configured to a great variety of shapes. For example, the pliable light guide 110 may include a wedge plate, or the pliable light guide 110 may be triangular pyramidal or have an irregular shape. The configuration thereof is not limited thereto.

The pliable light guide 110 is optically transmissive and for guiding the light. For example, the refractive index of the pliable light guide 110 can be greater than that of the light propagating medium outside the pliable light guide 110. Consequently, the light can be guided and propagate within the pliable light guide 110 by total internal reflection. In the instant disclosure, the refractive index of the pliable light guide 110 ranges from 1.0 to 1.85. In addition, the pliable light guide 110 can be made of materials allowing the passage of radiation at one or more specified wavelengths, thereby the pliable light guide 110 is transparent. For example, the pliable light guide 110 can be transparent to the radiation at one or more wavelengths in the range of the visible spectrum. In another exemplary embodiment, the pliable light guide 110 can be transparent to the radiation at one or more wavelengths in the range of the infrared or ultraviolet spectrum. In the instant disclosure, the pliable light guide 110 can be formed from glass, plastic, electrochromic glass, or smart glass. However, the materials for making the pliable light guide 110 are not limited thereto. In an exemplary embodiment, the pliable light guide 110 includes, for example, a flexible board, a plastic board, a reflective board, an acrylic board, a polycarbonate (PC) board, the of polyvinyl chloride (PVC) board, polyethylene (PE) board or a polypropylene (PP) board.

Furthermore, the light guide is pliable. For example, the pliable light guide 110 can be made of flexible materials, including polyesters, polycarbonates, ink, light-activated resin, or optical clear adhesive. To put it concretely, the pliable light guide 110 can be bent, folded, or rolled, or the pliable light guide 110 can be compressed to change the shape thereof. Thereby, depending on the actual needs, the users can make the light collecting module 100a into different forms by bending, folding, rolling or compressing the pliable light guide 110. As shown in FIG. 1A, the pliable light guide 110 is S-shaped when the light collecting module 100 a is in use. However, the instant disclosure is not limited thereto.

The surface S of the pliable light guide 110 has the first area 111, the second area 112, and the third area 113. The first area 111 and the second area 112 face each other, and the third area 113 is adjacent to the first area 111 or the second area 112. As shown in FIG. 1A in the present disclosure, the first area 111 is the part of the upper surface S1 that is adjacent to the side surface S3. The second area 112 is the part of the lower surface S2 that is adjacent to the side surface S3, and the third area 113 is the side surface S3. It is worth to note that the surface S of the pliable light guide 110 may have more than one first area 111, second area 112, or third area 113. In the present embodiment, for example, the surface S of the pliable light guide 110 may further have the first area 111, the second area 112, and the third area 113.

As shown in FIG. 1A, the first area 111 is the part of the lower surface S2 that is adjacent to the side surface S4. The second area 112 is the part of the upper surface S1 that is adjacent to the side surface S4, and the third area 113 is the side surface S4. It is worth to note that the configurations of the positioning, the shape, or the size of the first area 111, the second, and the third area 113 may vary with respect to, for example, the shape, the deflection property or the refractive index of the pliable light guide 110 and the instant disclosure is not limited thereto.

A plurality of optical structures 114 parallel to each other are formed in the second area 112 of the surface S, and each optical structure 114 is a straight elongate rib projecting inward into the pliable light guide 110. As shown in FIG. 2A, a cross section of each optical structure 114 is triangular and has an apex angle T, which ranges from 20 to 160 degrees. The optical structures 114 are parallel to each other and the immediately adjacent optical structures 114 are separated by lengthwise intervals. The cross section of all optical structures 114 is identical, and the intervals between the immediately adjacent optical structures 114 are identical as well. In an alternate exemplary embodiment, each optical structure 114 is part of an array of the optical structures 114, and the optical structures 114 are distributed irregularly or periodically in the second area 112. The cross section of the optical structure 114 can be trapezoidal, semicircular or wavy-shaped, the optical structure 114 can be curved or have non linear extent, and the instant disclosure is not limited thereto. In addition, the configurations of the number, the shape, the size, and the positioning of the optical structure 114 may vary with respect to the actual needs and design requirements, and the optical structures 114 may have different shapes or sizes. For example, in another embodiment, each optical structure 114 can be a rounded projecting bulge, and the optical structure 114 formed in different second areas 112 may alter.

It is worth to note that the optical structures 114 can be distributed irregularly or periodically in each second area 112. The distribution density of the optical structures 114 in each second area 112 can vary according to the deflection property of the pliable light guide 110 and the configurations of the distribution of the optical structures 114 may vary with respect to the actual needs and design requirements. In an exemplary embodiment, the larger the flexural modulus of the pliable light guide 110, the greater the distribution density of the optical structures 114. That is to say the more optical structures 114 are formed in the second area 112. On the other hand, the less the flexural modulus of the pliable light guide 110, the less the distribution density of the optical structures 114. That is to say the less optical structures 114 are formed in the second area 112. The degree of the apex angle T varies with respect to the flexural modulus of the pliable light guide 110. The apex angle T ranges from 20 to 160 degrees, and the apex angle T is preferably 120 degrees.

In another embodiment of the disclosure, the optical structures 114 formed in the second area 112 have different sizes. In an exemplary embodiment, the larger the curvature of the pliable light guide 110 when the light collecting module 100a is in use, the greater the size of the optical structures 114. That is to say the greater the vertical height of the optical structure 114 to the surface S. On the other hand, the less the curvature of the pliable light guide 110 when the light collecting module 100a is in use, the less the size of the optical structures 114. That is to say the less the vertical height of the optical structure 114 to the surface S.

Furthermore, the optical structures 114 formed in the single second area 112 may have different sizes with respect to the curvature of different parts of the second area 112 when the light collecting module 100a is in use. To put it in concrete, in an exemplary embodiment, the part of the second area 112 that is adjacent to the third area 113 has a less curvature when the light collecting module 100a is in use. The optical structures 114 formed in the part of the second area 112 adjacent to the third area 113 may have smaller size. On the other hand, the part of the second area 112 that is apart from the third area 113 has a greater curvature when the light collecting module 100a is in use. The optical structures 114 formed in the part of the second area 112 that is apart from the third area 113 may have greater size. However, the instant disclosure is not limited thereto.

Please refer to FIGS. 1A and 1B. The inner light source 120 is connected to the pliable light guide 110 for emitting light. In the present disclosure, the inner light source 120 can be embedded in the pliable light guide 110. The inner light source 120 can be a point light source and contain a LED. In an alternate embodiment, the inner light source 120 can be a line light source, a surface S light source, or other types of light source. The inner light source 120 may contain a laser diode, cold cathode fluorescent lamp (CCFL) or other types of light-emitting element. The inner light source 120 can emit the light directly or indirectly by reflection. Conventional light sources well known to those skilled in the art may be employed and the instant disclosure is not limited thereto.

The pliable light guide 110 can redirect the light from the inner light source 120 such that the light from the inner light source 120 is guided to the first area 111 and exits the light guide, whereby forming a surface S light source. To put it in concrete, the light from the inner light source 120 can be guided within the light guide by refraction or reflection and strike the surface S in the second area 112, and the optical structure 114 formed in the second area 112 can change the propagation direction of the light. That is to say the optical structure 114 can redirect the light from the inner light source 120 such that the light from the inner light source 120 is guided to the first area 111 by refraction or reflection and exits the light guide forming the surface S light source. In an alternate embodiment, the optical structure 114 may redirect the light from the inner light source 120 such that the light from the inner light source 120 is guided to the other parts of the surface S by refraction or reflection and exits the light guide for forming a surface S light source. For example, the optical structure 114 may redirect the light from the inner light source 120 such that the light from the inner light source 120 is guided to the second area 112 by refraction or reflection and exits the light guide for forming a surface S light source.

In addition, the optical structure 114 can redirect the ambient light, which is from an external light source disposed outside the light collecting module 100a, incident on the first area 111 of the surface S such that the ambient light is guided to the third area 113 by refraction or reflection. The external light source can be the natural light source such as the sun or can be a light-emitting device containing a laser diode. As shown in FIGS. 1A and 1B in the present disclosure, the ambient light incident on the first area 111 can propagate within the pliable light guide 110 and be guided to the second area 112 by refraction or reflection. After striking the surface S in the second area 112, the optical structure 114 formed in the second area 112 can change the propagation direction of the light. That is to say the optical structure 114 can redirect the ambient light such that the ambient light is guided to the third area 113 by refraction or reflection. Specifically, the optical structure 114 formed in the second area 112 can change the propagation direction of the ambient light incident on the first area 111 such that the ambient light is guided toward the third area 113 with a small incidence angle so to allow desired luminance efficiency in the third area 113 of the pliable light guide 110.

Photocell 130 may convert the light energy to other forms of energy. For example, photocell 130 may convert the light energy into electrical energy. Specifically, photocell 130 can generate and support an electric current without being attached to any external voltage source when exposed to light. In the present disclosure, the photocell 130 can be a photovoltaic cell such as photoelectrochemical cell, dye-sensitized solar cell, polymer solar cell, nano-crystalline solar cell or the like. The photocell 130 can be made of semiconductor materials containing monocrystalline silicon, polycrystalline silicon, cadmium telluride (CdTe), copper indium selenide (CIS), copper indium gallium selenide (CIGS), Gallium arsenide (GaAs) and the combination thereof. In another embodiment, the photocell 130 can include a plurality of stacked layers of photovoltaic material. Specifically, the photocell 130 may include a PN junction layer, an electron hole junction layer, a silicon layer, a nano organic layer, a multiple layer of compounds and the combination thereof.

As shown in the FIGS. 1A and 1B in the present disclosure, the photocell 130 is adjacent to the third area 113 of the pliable light guide's surface, and the light guided to the third area 113 can be incident on the photocell 130 to be optically coupled to the photocell 130. In the instant embodiment, the photocell 130 is disposed around the pliable light guide 110 yet the photocell 130 may be attached to the surface S of the pliable light guide 110. Other configurations of the positioning of the photocell 130 with respect to the pliable light guide 110 are also possible, and the instant disclosure is not limited thereto. It is worth to note that the light collecting module 100a of the instant embodiment can have two photocells 130 adjacent to each third area 113. In an alternate embodiment, the light collecting module 100a may have more than one photocell 130 adjacent to the single third area 113.

The light collecting module 100a can further include a reflective layer 140 disposed in the second area 112. The reflective layer 140 can be a metal deposition layer, a metal film or a metal printing layer, and the reflective layer 140 may contain a high reflectance material such as silver (Ag), aluminum (Al), gold (Au), copper (Cu), palladium (Pd), platinum (Pt), radium (Rd), or the like. When the ambient light incident on the first area 111 strikes the surface S in the second area 112, the ambient light can be guided within the pliable light guide 110 by total internal reflection at the reflective layer 140 in the second area 112 so as to prevent the light from escaping from the pliable light guide 110 plate or to reduce the loss in the guided light, whereby providing highly utilization. As shown in the FIGS. 1A and 1B in the present disclosure, the reflective layer 140 is an organic coating layer containing a high reflectance material. In addition, the reflective layer 140 is a pliable layer. Thereby the reflective layer 140 is not easily peeled off when the light collecting module 100a is in use, specifically, when the pliable light guide 110 is bent to certain shape. The reflective layer 140 preferably measure more than 500 angstrom (A) in thickness and completely covers the surface S in the second area 112. In an alternate embodiment, the reflective layer 140 may have a plurality of dots made of metal thin film ordered distributed in the second area 112.

In addition, in another embodiment, the light collecting module 100a can be disposed on a display device. To put it in concrete, the display may further include a substrate and a display unit. The light collecting module 100a can be disposed atop the substrate, or the light collecting module 100a can be disposed atop, below, aside, in front of, or within the displaying unit.

(Second Embodiment of a Light Collecting Module).

Figure 2B:
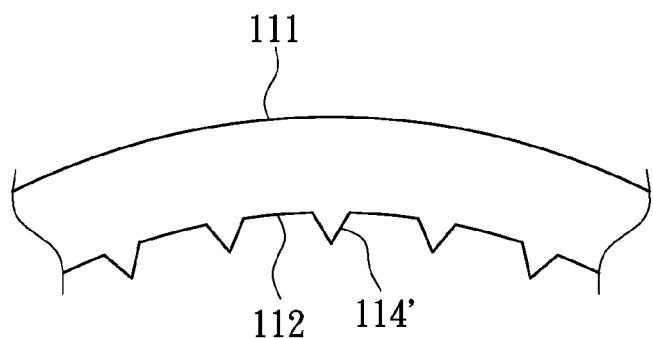
FIG. 2B is a side enlarged view, partially in area, showing a light collecting module in accordance with another embodiment of the instant disclosure.

Attention is now invited to FIG. 2B is a side enlarged view, partially in area, showing a light collecting module 100a in accordance with another embodiment of the instant disclosure. The light collecting module 100a is similar to the aforementioned light collecting module 100a and the description hereinafter further explains the difference there-between.

According to the embodiment, a plurality of the optical structures 114' parallel to each other are formed in the second area 112 of the surface S, and each optical structure 114' is a straight elongate groove projecting outward from the pliable light guide 110. A cross section of each optical structure 114' is triangular, yet the cross section of the optical structure 114' may be trapezoidal, semicircular or wavy shaped in an alternate embodiment. The optical structure 114' can be curved or have non liner extent in another embodiment, and the instant disclosure is not limited thereto.

(Third Embodiment of a Light Collecting Module).

Figure 2C:
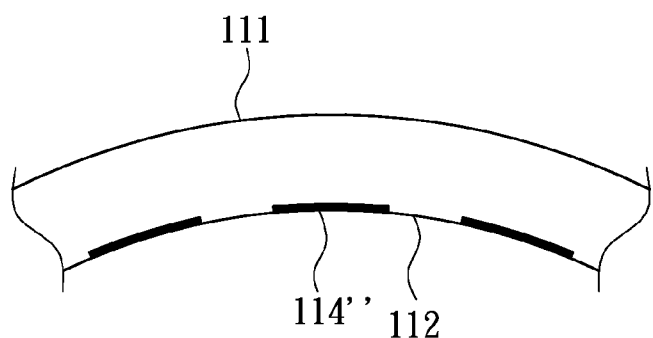
FIG. 2C is a side enlarged view, partially in area, showing a light collecting module in accordance with another embodiment of the instant disclosure.

Attention is now invited to FIG. 2C is a side enlarged view, partially in area, showing a light collecting module 100a in accordance with another embodiment of the instant disclosure. The light collecting module 100a is similar to the aforementioned light collecting module 100a and the description hereinafter further explains the difference there-between.

According to the embodiment, a plurality of the optical structures 114" parallel to each other are formed in the second area 112 of the surface S, and each optical structure 114" is a printed pattern layer projecting inward into the pliable light guide 110. For example, the pattern of the optical structures 114" may be formed by an array of rows or columns parallel to each other or may be formed by a matrix composed of rows or columns, or have an irregular shape. The optical structures 114" may be configured to having a great variety of patterns having different orientations and the configuration thereof is not limited thereto. Furthermore, the materials for forming the optical structures 114" are not limited thereto.

(Fourth Embodiment of a Light Collecting Module).

Figure 3A:
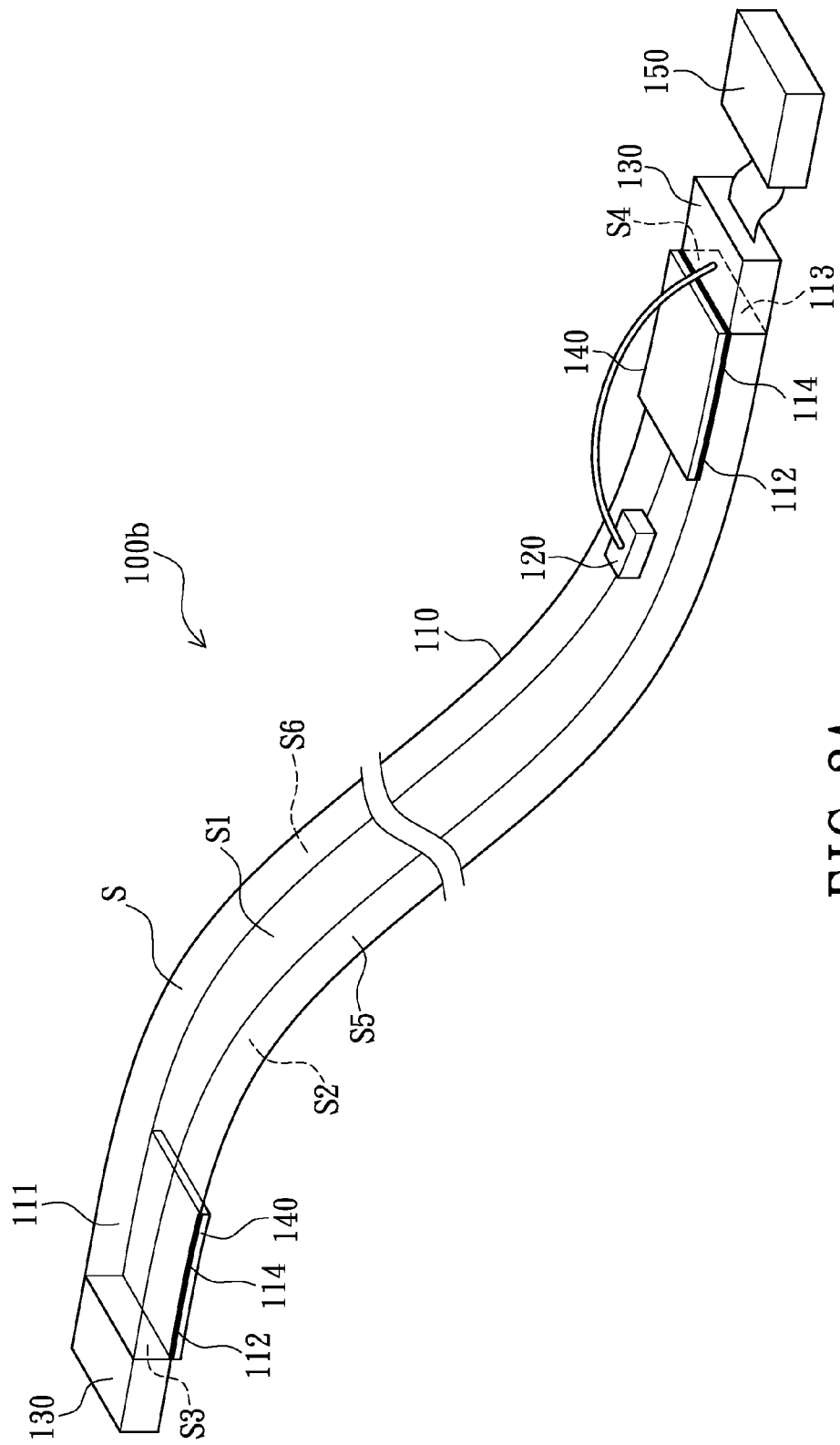
FIG. 3A illustrates a perspective view of a light collecting module in accordance with another embodiment of the instant disclosure.
Figure 3B:
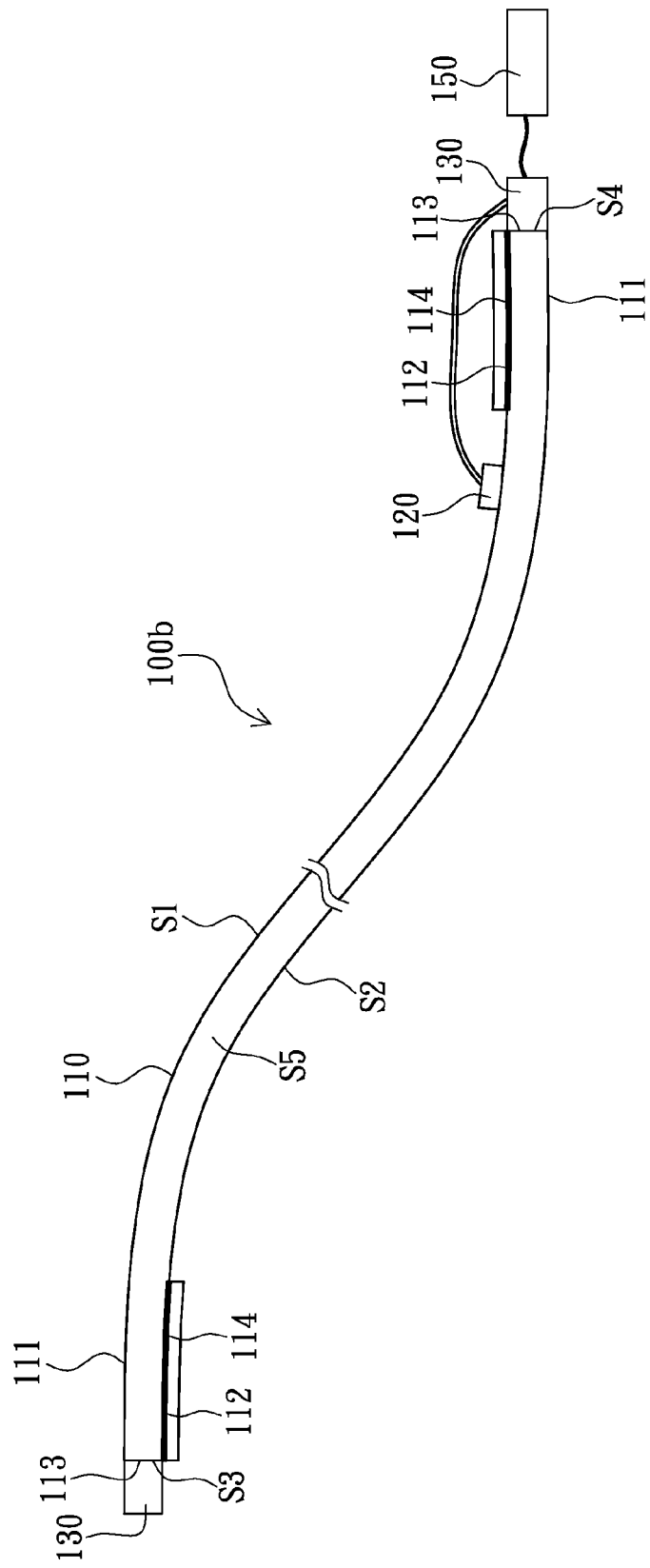
FIG. 3B illustrates a side view of a light collecting module in accordance with FIG. 3A.

Attention is now invited to FIGS. 3A and 3B, FIG. 3A illustrates a perspective view of a light collecting module 100b in accordance with another embodiment of the instant disclosure, and FIG. 3B illustrates a side view of a collecting module 100b in accordance with FIG. 3A. The light collecting module 100b is similar to the aforementioned light collecting module 100b and the description hereinafter further explains the difference there-between.

According to the embodiment, as shown in FIGS. 3A and 3B, the inner light source 120 is disposed atop and attached to the upper surface S1 of the pliable light guide 110. The photocell 130 is disposed on and attached to the surface S in the third area 113. The photocell 130 is electrically connected to the inner light source 120, whereby the electricity generated by the photocell 130 can be provided to the inner light source 120. The light collecting module 100b further includes a battery module 150 coupled to the photocell 130. In an alternate embodiment, the photocell 130 can be disposed within the pliable light guide 110 and electrically connected to the inner light source 120.

In an exemplary embodiment, the light collecting module 100b may further include an energy accumulator and a switch. The accumulator is electrically connected to the photocell 130 for storing the electrical energy converted from the photocell 130, and the switch is electrically connected to the accumulator for switching to use the energy stored in the accumulator when the energy stored in the accumulator is below a predetermined level. In addition, the light collecting module 100b may further include a battery and a control circuit. The battery is coupled to the inner light source 120. When the energy stored in the battery is below a predetermined level, the switch can switch to use the energy stored in the accumulator. When the energy stored in the battery is below a predetermined level, the control circuit can control the light collecting module 100b to recharge the battery.

(Fifth Embodiment of a Light Collecting Module).

Figure 4A:
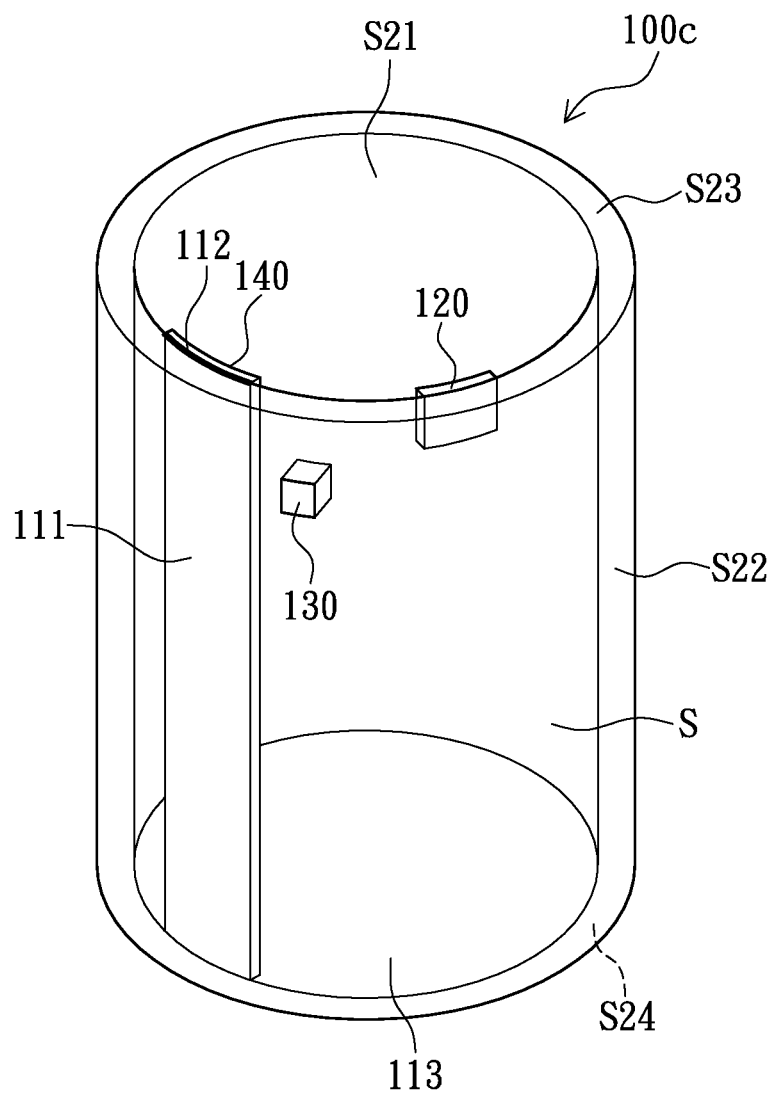
FIG. 4A illustrates a perspective view of a light collecting module in accordance with another embodiment of the instant disclosure.
Figure 4B:
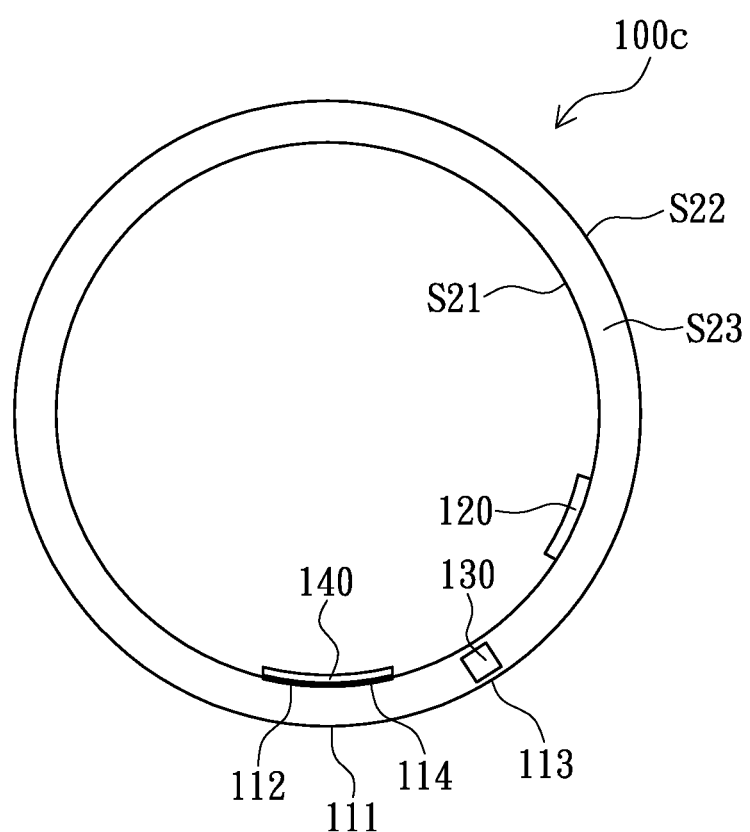
FIG. 4B illustrates a top plane view of a light collecting module in accordance with FIG. 4A.

Attention is now invited to FIGS. 4A and 4B, FIG. 4A illustrates a perspective view of a light collecting module 100c in accordance with another embodiment of the instant disclosure, and FIG. 4B illustrates a top plane view of a light collecting module 100c in accordance with FIG. 4A. The light collecting module 100c is similar to the aforementioned light collecting module 100c and the description hereinafter further explains the difference there-between.

As shown in FIG. 4A in the instant embodiment, the pliable light guide 110 can be rolled to a cylindrical shape. An inner side surface S21, an outer side surface S22, a top surface S23 and a bottom surface S24 form the surface S of the pliable light guide 110. In other words, the inner side surface S21 and the outer side surface S22 are bound by the top surface S23 and the bottom surface S24. The first area 111 is a part of the outer side surface S22, and the second area 112 is part of the inner side surface S21 that is facing the first area 111. The third area 113 is part of outer side surface S22 that is adjacent to the first area 111. The inner light source 120 is disposed on and attached to the inner side surface S21, and the photocell 130 embedded in the pliable light guide 110 is adjacent to the third area 113.

The light from the inner light source 120 incident on the surface S can be guided within the pliable light guide 110 toward the second area 112 by refraction or reflection, and the optical structure 114 formed in the second area 112 can change the propagation direction of the light. That is to say the optical structure 114 can redirect the light from the inner light source 120 such that the light from the inner light source 120 is guided to the first area 111 by refraction or reflection and exits the light guide for forming a surface S light source.

In addition, the ambient light incident on the first area 111 can propagate within the pliable light guide 110 and be guided to the second area 112 by refraction or reflection. Further, the optical structure 114 formed in the second area 112 can change the propagation direction of the light. That is to say, the optical structure 114 can redirect the ambient light such that the ambient light is guided to the third area 113 with a small incidence angle by refraction or reflection.

As shown in the FIGS. 1A and 1B in the present disclosure, the photocell 130 is adjacent to the third area 113 of the pliable light guide's surface, and the light guided to the third area 113 can be incident on the photocell 130 to be optically coupled to the photocell 130.

(Possible Effects of an Embodiment of a Light Collecting Module)

According to the embodiment, the light collecting module 100a, 100b, and 100c includes the optical structure 114, 114', and 140" so as to change the propagation direction of the light incident on the surface S within the pliable light guide 110, whereby the light guided to the third area 113 can be incident on the photocell 130 and be optically coupled to the photocell 130. The light collecting module 100a, 100b, and 100c can allow highly amount of the ambient light guided to the third area 113 or optically coupled to the photocell 130, thereby improving the efficiency of the photocell 130. In addition, the optical structure 114, 114', and 140" formed in the second area 112 may redirect the light from the inner light source 120 to the surface S of the light guide and exits the light guide for forming a surface S light source.

According to the embodiment, the light collecting module 100a, 100b, and 100c can be bent, folded, or rolled for being disposed on a non-planer surface of a device to fit the external institutional environment. Furthermore, the light collecting module 100a, 100b, and 100c may be configured to a great variety of shapes and the configuration thereof is not limited thereto. For example, with the appearance of the laptop or the Tablet PC, the light collecting module 100a, 100b, and 100c can be realized as a protective sleeve for the laptop or the tablet computer, and the photocell 130 can be a solar cell. Thereby, the light collecting module 100a, 100b, and 100c including the photocell 130 can provide electricity for the laptop or the tablet, or to recharge the computer peripheral accessories.

In other applications, the light collecting module 100a, 100b, and 100c can be disposed on clothing. For example, the light collecting module 100a, 100b, and 100c may allow highly amount of the ambient light optically coupled to the photocell 130 in order to improve the efficiency of the photocell 130, and the photocell 130 can be a solar cell. The light collecting module 100a, 100b, and 100c including the photocell 130 can provide electricity for handheld devices such as PDAs, mp3 player, mobile phone, etc. Meanwhile, the electrical energy generated by the photocells 130 can be provided to the inner light source 120, thereby forming the surface S light source so as to illuminate in the dark. For example, the light collecting module 100a, 100b, and 100c can be disposed on vests and jackets worn by airline ground staff, police, firefighters and emergency workers, to illuminate in the dark to enhance visibility.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A light collecting module comprising:
   a pliable light guide, a surface of the light guide having a first area, a second area, and a third area, wherein the first area and the second area are facing each other, the third area is adjacent to the first or second area, and the surface has at least one optical structure formed in the second area;
   an inner light source for emitting light, wherein the inner light source is connected to the pliable light guide, wherein the optical structure is for redirecting the light from the inner light source such that the light from the inner light source is guided to the surface of the light guide by refraction or reflection and exits the light guide; and
   a photocell adjacent to the third area of the surface, wherein the optical structure is for redirecting ambient light incident on the first or second area of the surface such that the ambient light is guided to the third area by refraction or reflection and incident on the photocell.

2. The light collecting module according to claim 1, wherein the pliable light guide comprises a wedge plate.

3. The light collecting module according to claim 1, wherein the refractive index of the pliable light guide ranges from 1.0 to 1.85.

4. The light collecting module according to claim 1, wherein the optical structure is for redirecting the light from the inner light source such that the light from the inner light source is guided to the first area or second area by refraction or reflection.

5. The light collecting module according to claim 1, wherein the optical structure comprises a projecting bulge, a projecting rib, a groove, or a printed pattern layer.

6. The light collecting module according to claim 1, wherein a cross section of the optical structure is triangular, trapezoidal, semicircular or wavy shaped.

7. The light collecting module according to claim 1, wherein the optical structure is part of an array of the optical structures, and the optical structures are distributed irregularly or periodically in the second area.

8. The light collecting module according to claim 1, wherein the photocell is attached to the surface of the pliable light guide.

9. The light collecting module according to claim 1, wherein the photocell is disposed within the pliable light guide and is electrically connected to the inner light source.

10. The light collecting module according to claim 1, further comprising a reflective layer disposed in the second area.

11. The light collecting module according to claim 1, wherein further comprising a battery module coupled to the photocell.

12. The light collecting module according to claim 1, wherein the photocell comprises a plurality of stacked layers of photovoltaic material.

13. The light collecting module according to claim 1, wherein the photocell comprises a PN junction layer, an electron hole junction layer, a silicon layer, a nano organic layer or a multilayer of compounds.

14. The light collecting module according to claim 1, wherein the pliable light guide comprises a flexible board, a plastic board, a reflective board, an acrylic board, a polycarbonate board, a polyvinyl chloride board, a polyethylene board or a polypropylene board.

15. The light collecting module according to claim 1, further comprising an energy accumulator and a switch, the accumulator electrically connected to the photocell for storing the electrical energy converted from the photocell, the switch electrically connected to the accumulator for switching to use the energy stored in the accumulator when the energy stored in the accumulator is below a predetermined level.

16. The light collecting module according to claim 15, further comprising a battery electrically connected to the inner light source, wherein the switch switches to use the energy stored in the accumulator when the energy stored in the battery is below a predetermined level.

17. The light collecting module according to claim 16, further comprising a control circuit for controlling the light collecting module to recharge the battery when the energy stored in the battery is below a predetermined level.

18. A display device comprising:
   a substrate;
   a displaying unit; and
   a light collecting module disposed atop the substrate, or the light collecting module disposed atop, below, aside, in front of, or within the displaying unit, the light collecting module comprising:
   a pliable light guide, a surface of the light guide having a first area, a second area, and a third area, wherein the first area and the second area are facing each other, the third area is adjacent to the first or second area, and the surface has at least one optical structure formed in the second area; and
   an inner light source for emitting light, wherein the inner light source is connected to the pliable light guide.

19. The display device according to claim 18, further comprising a photocell adjacent to the third area of the surface, wherein the optical structure is for redirecting ambient light incident on the first or second area of the surface such that the ambient light is guided to the third area by refraction or reflection and incident on the photocell, and the optical structure is for redirecting the light from the inner light source such that the light from the inner light source is guided to the surface of the light guide by refraction or reflection and exits the light guide.

* * * * *